United States Patent
Pirilä et al.

(10) Patent No.: US 6,728,555 B1
(45) Date of Patent: Apr. 27, 2004

(54) DISPLAY FRAME WITH INTEGRATED ESD SHIELD, AND A USER INTERFACE CONSTRUCTION

(75) Inventors: Jouko Pirilä, Turku (FI); Ari-Pekka Töykkälä, Turku (FI)

(73) Assignee: Nokia Mobile Phones, Ltd., Espoo (FI)

( * ) Notice: Subject to any disclaimer, the term of this patent is extended or adjusted under 35 U.S.C. 154(b) by 0 days.

(21) Appl. No.: 09/672,464

(22) Filed: Sep. 28, 2000

(30) Foreign Application Priority Data

Sep. 29, 1999 (FI) .............................................. 19992083

(51) Int. Cl.⁷ ............................................... H04M 1/00
(52) U.S. Cl. ................... 455/566; 455/90.3; 455/550.1; 455/575.8; 361/816; 379/451
(58) Field of Search .......................... 455/550.1, 575.1, 455/90.3, 128, 300, 301, 351, 566; 361/816, 818; 174/35 R, 35 GC; 345/87; 379/437, 368, 433.07, 433.04, 451

(56) References Cited

U.S. PATENT DOCUMENTS

| | | | | |
|---|---|---|---|---|
| 4,667,266 A | * | 5/1987 | Masuoka et al. ........... 361/212 |
| 5,271,056 A | * | 12/1993 | Pesola et al. ................ 379/429 |
| 5,357,570 A | * | 10/1994 | Tomura et al. ......... 379/433.01 |
| 5,371,791 A | * | 12/1994 | Schwartz et al. ...... 379/433.01 |
| 5,383,097 A | * | 1/1995 | DeLucia et al. ............ 361/816 |
| 5,392,461 A | * | 2/1995 | Yokoyama .................... 455/90 |
| 5,408,077 A | * | 4/1995 | Campo et al. ............... 235/380 |
| 5,577,267 A | * | 11/1996 | Jungles-Butler et al. . 455/575.1 |
| 5,675,396 A | * | 10/1997 | Tsunehiro ..................... 349/59 |
| 5,722,055 A | * | 2/1998 | Kobayashi et al. ........ 455/575.8 |
| 5,731,963 A | * | 3/1998 | Heiss et al. .................... 455/90 |
| 5,764,492 A | * | 6/1998 | Ady et al. ................... 361/818 |
| 5,825,606 A | * | 10/1998 | Villain et al. ................ 361/220 |
| 5,841,857 A | * | 11/1998 | Zoiss et al. ............ 379/433.04 |
| 5,844,166 A | * | 12/1998 | Halttunen et al. ........... 455/300 |
| 5,847,938 A | * | 12/1998 | Gammon ..................... 361/816 |
| 5,867,772 A | * | 2/1999 | Jonsson et al. ........... 455/575.1 |
| 6,006,118 A | * | 12/1999 | Stephenson .................. 455/90 |
| 6,041,120 A | * | 3/2000 | Olkkola ........................ 379/368 |
| 6,058,293 A | * | 5/2000 | Phillips .................... 455/575.1 |
| 6,126,454 A | * | 10/2000 | Flegeo .......................... 439/67 |
| 6,226,535 B1 | * | 5/2001 | Sun .............................. 455/566 |
| 6,317,588 B1 | * | 11/2001 | Curtis et al. ................. 379/429 |
| 6,324,074 B1 | * | 11/2001 | Lunden ..................... 174/35 R |

FOREIGN PATENT DOCUMENTS

| | | |
|---|---|---|
| DE | 3617734 A1 | 12/1987 |
| EP | 0920166 A2 | 6/1999 |
| FI | FI/EP 00755178 | 1/1997 |
| WO | WO97/36380 | 10/1997 |
| WO | WO 97/40655 | 10/1997 |
| WO | WO 98/39785 | 9/1998 |
| WO | WO98/47340 | 10/1998 |

* cited by examiner

*Primary Examiner*—Charles Appiah
(74) *Attorney, Agent, or Firm*—Perman & Green, LLP

(57) ABSTRACT

A user interface construction is provided for a portable terminal of a communication system. It comprises a circuit board (301, 603) having a first surface as well as a keypad (303, 304), a display unit (307) and a loudspeaker (306) on said first surface. Additionally it comprises an outer cover (311) arranged to essentially cover said keypad (303, 304), display unit (307) and loudspeaker (306). It comprises also between the keypad (303, 304), display unit (307) and loudspeaker (306) and the outer cover (311) an extended display frame (308, 602). It is electrically conductive, coupled to a ground potential member (604) appearing on the circuit board (301, 603) and arranged to hold the keypad (303, 304), display unit (307) and loudspeaker (306) in place with respect to the circuit board (301, 602). Additionally it is arranged to essentially cover the keypad (303, 304), the display unit (307) and the loudspeaker (306) so as to protect them against electrostatic discharges.

21 Claims, 4 Drawing Sheets

DISPLAY FRAME WITH INTEGRATED ESD SHIELD, AND A USER INTERFACE CONSTRUCTION

TECHNOLOGICAL FIELD

The invention concerns generally the structural technology of mobile telephones and similar portable electronic terminals. Especially the invention concerns the field of shielding the user interface of a mobile telephone or a similar portable terminal against electrostatic discharges and electromagnetic interference.

BACKGROUND OF THE INVENTION

The user interface of mobile telephones and similar portable electronic terminals typically comprises a display, which is almost invariably an LCD (liquid crystal display) screen, and a selection of keys. In mobile telephones the user interface comprises additionally a microphone, a speaker and a buzzer for emitting ringing tones. A very widely used structural concept is to build the user interface on one side of a relatively large printed circuit board (compared to the overall size of the device) which is then covered with an outer cover to encase the user interface side of the device and to achieve a desired outer appearance.

Some kind of conductive shielding is required on top of the user interface to make sure that static charges that accumulate into the user and/or the portable terminal will not find a discharge path through the user interface into the sensitive electronic components inside the terminal. FIG. 1 is an exploded cross-sectional view that shows a known structural arrangement which is built on a PCB 101 with a number of contact pads on its upper surface. An insulating film 102 covers the PCB except of those contact pads onto which components are to be placed. The keyboard part comprises a dome sheet 103 (or alternatively a selection of individual key domes) made of some resilient material that is electrically conductive at least at the concave surface of each dome. Additionally the keyboard part comprises a rubbery keymat 104 where the bulging protrusions constitute the visible parts of the keys. A microphone 105 is coupled to its contact pad(s), and the keyboard-microphone entity is covered by an ESD shield 106 which is made of a thin sheet of stainless steel or other conductive material.

The display part comprises an LCD display unit 107 and a metallic ESD frame 108 covering it. Similarly the loudspeaker part of the structure comprises the loudspeaker proper 109 and a metallic ESD cover 110. A pair of highly elastic protective gaskets 111a and 111b are inserted on top of the outer edge of the loudspeaker part and display part respectively, and the whole user interface is covered with an outer cover 112. A transparent window 113 covers the display unit in the completed construction.

FIG. 2 is a cross-sectional view of the prior art structure shown in FIG. 1 in assembled composition. The projections that protrude downwards from the edges of the metallic ESD shields 106, 108 and 110 are bent around the edges of the PCB 101 so that they come into contact with a number of grounding pads (not shown).

Another known approach to the task of fighting ESD is to use discrete components like capacitors and ferrites on a printed circuit board to prevent the eventual ESD discharges that get coupled to certain contact pads from proceeding to the more sensitive parts of the circuitry.

SUMMARY OF THE INVENTION

The problem of the prior art arrangements is that they are relatively complicated from the viewpoint of automated assembling. It is therefore an object of the present invention to provide an ESD shielding solution for the user interface parts of a mobile telephone or a similar portable terminal that is simpler to assemble than the structure of FIGS. 1 and 2. It is an additional object of the invention that the ESD shield should allow the user interface parts to be made very thin in the direction perpendicular to the surface of the PCB.

The objects of the invention are achieved by providing an integrated display frame and ESD shield component the shielding effect of which extends over the whole user interface. Advantageously the integrated display frame and ESD shield component also constitutes a support for the gasket(s) that separate it from the device's outer cover.

The display frame according to the invention is characterized in that it comprises a first extended portion which is elevated, perforated and thereby arranged to essentially cover a loudspeaker located in the vicinity of said display unit, and a second extended portion which is perforated and thereby arranged to essentially cover a keypad located in the vicinity of said display unit.

The invention applies also to a user interface construction for a portable terminal of a communication system, which comprises a circuit board having a first surface, a keypad, a display unit and a loudspeaker on said first surface and an outer cover arranged to essentially cover said keypad, display unit and loudspeaker. It is characterized in that it comprises between the keypad, display unit and loudspeaker and the outer cover an extended display frame which is electrically conductive, coupled to a ground potential member appearing on the circuit board and arranged to hold the keypad, display unit and loudspeaker in place with respect to the circuit board and to essentially cover the keypad, the display unit and the loudspeaker so as to protect them against electrostatic discharges.

According to the present invention, the number of separate components in the user interface structure can be reduced and the assembly phase correspondingly simplified by extending the frame of the display unit to cover also other parts of the user interface. A single structural component may act as a mechanical holder for the display screen and other user interface parts, as well as a complete ESD shield.

In a further developed embodiment of the invention the integrated ESD shield acts even as a supporting insert for the gasket(s) that are used e.g. between the display part and the outer cover and/or between the loudspeaker part and the outer cover and/or between the microphone and the outer cover. An advantageous way of manufacturing the gasket(s) is injection moulding, in which case the integrated ESD shield may be put into the mold as a so-called insert before the injection of the gasket material. The integrated ESD shield may comprise perforated portions or other specific design details in order to enhance its usability as an insert.

BRIEF DESCRIPTION OF DRAWINGS

The novel features which are considered as characteristic of the invention are set forth in particular in the appended Claims. The invention itself, however, both as to its construction and its method of operation, together with additional objects and advantages thereof, will be best understood from the following description of specific embodiments when read in connection with the accompanying drawings.

Figure 1:
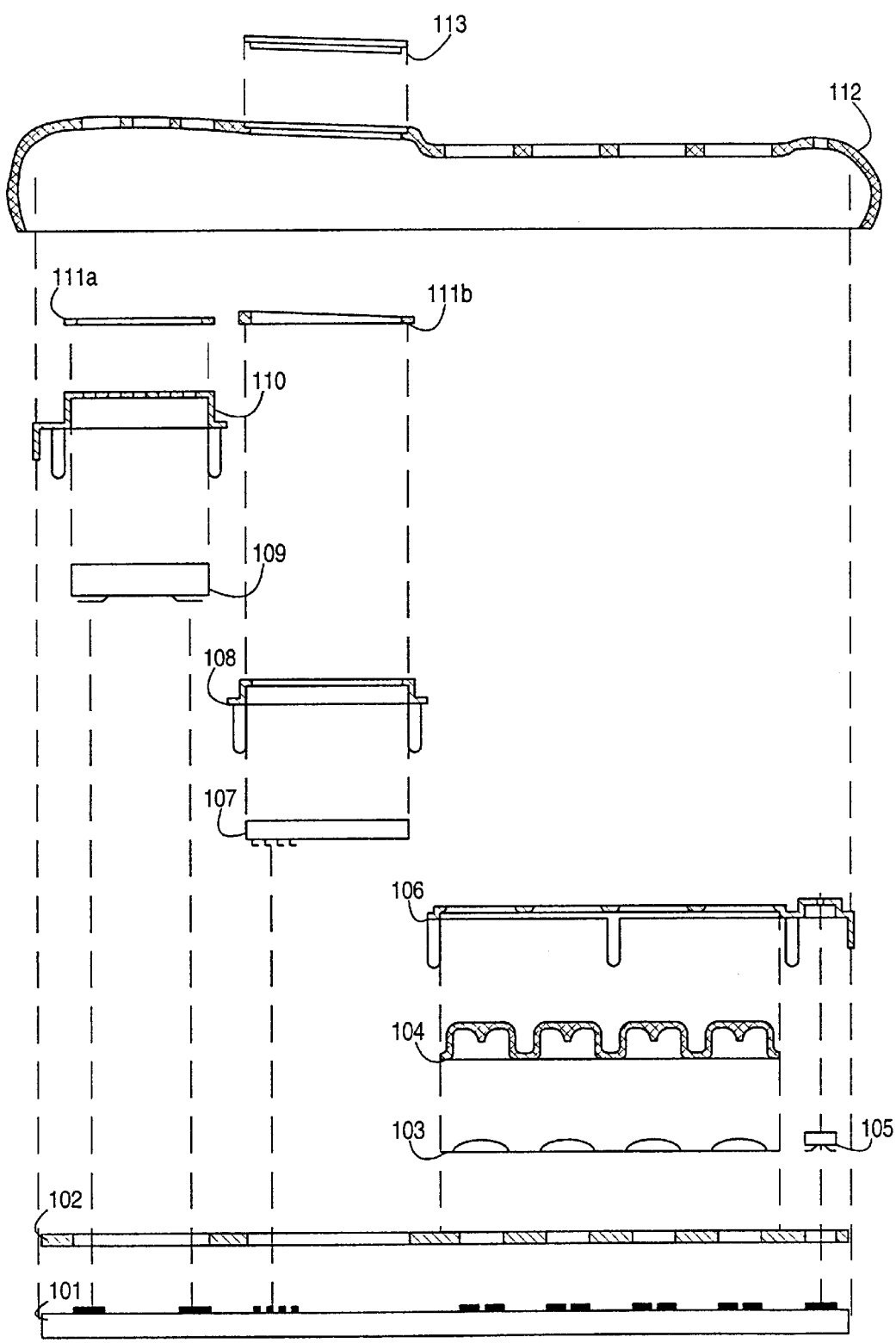
FIG. 1 illustrates a known user interface construction in a disassembled composition.
Figure 2:
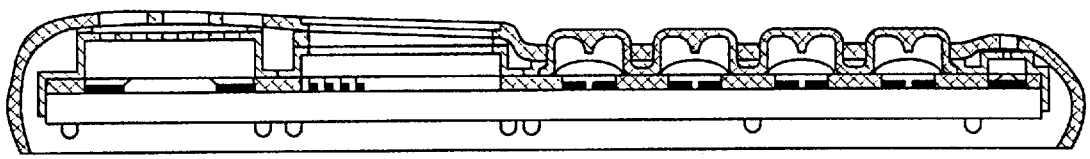
FIG. 2 illustrates the known construction of FIG. 1 in an assembled composition, FIG. 3 illustrate a user interface construction according to an embodiment of the invention in a disassembled composition.

In the description of prior art we have discussed FIGS. 1 and 2, so the following description of the advantageous embodiments of the invention concentrates on FIGS. 3 to 6.

DETAILED DESCRIPTION OF THE INVENTION

Figure 3:
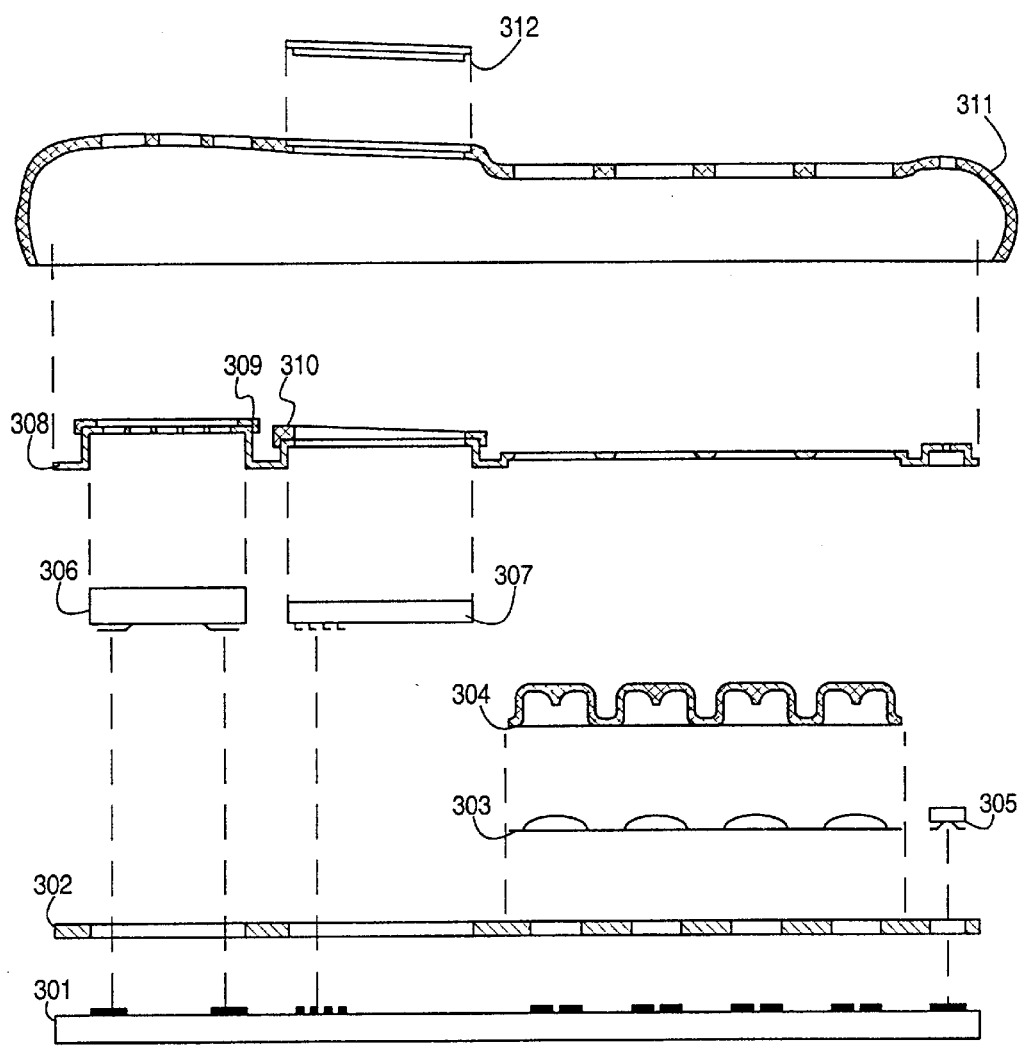

At the bottom of FIG. 3 there is a printed circuit board 301 with a first surface on which a number of coupling pads and -strips appear. An insulating film 302 comes on top of said first surface and covers all parts of it except those coupling pads and -strips onto which certain components are to be attached. In the keyboard part there is a dome sheet or a collection of individual domes 303 and an elastic keymat 304 which may be similar to the corresponding parts of the known constructions described earlier. A microphone 305, a loudspeaker 306 and an LCD display unit 307 are also shown in FIG. 3.

According to an embodiment of the invention there are no separate ESD shields for the keyboard part, the loudspeaker or the microphone, but an extended display frame 308 which spans the whole length of the printed circuit board and essentially covers all user interface parts. With essential covering we mean that because the microphone, the keypad, the display and the loudspeaker all necessitate a number of holes through the (non-transparent) ESD shield, the extended display frame 308 covers said parts except for the openings needed for passing sound, movement and/or light through it during the normal use of the user interface parts.

The ESD shield or extended-display frame 308 could be used together with elastic gaskets of a known kind. However, FIG. 3 shows the elastic gaskets 309 and 310 that are used to separate the loudspeaker part and the display part from the outer cover of the portable terminal as integrated parts of the ESD shield. A similar integrated elastic gasket could be provided for the microphone. The outer cover 311 and display window 312 may be similar to the corresponding parts of the known constructions described earlier.

Figure 4:
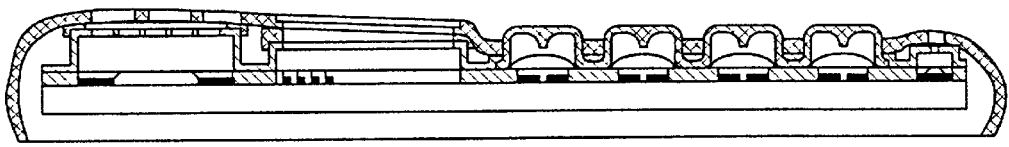
FIG. 4 illustrates the construction of FIG. 3 in an assembled composition.

FIG. 4 shows the construction of FIG. 3 in an assembled composition. Here we have not shown any specific means of attaching the parts together, but it is clear to the person skilled in the art that a number of attachment arrangements can be applied. A conductive contact between the ESD shield and the ground plane of the printed circuit board (not specifically shown) should be established in order for the ESD field to fulfil its tasks correctly.

Figure 5A:
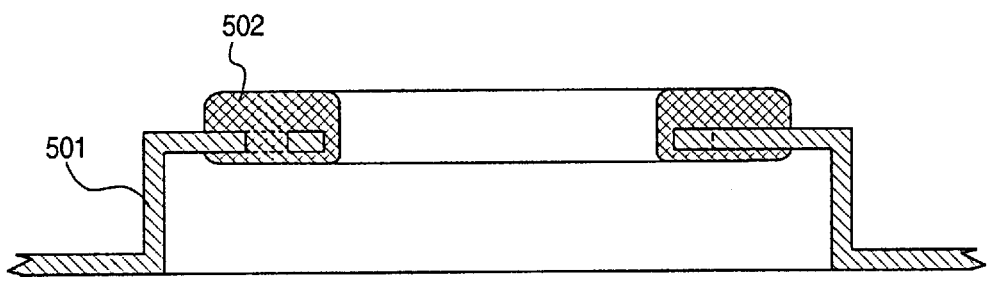
FIG. 5 illustrates a detail of an ESD shield according to an advantageous embodiment of the invention and FIG. 6 illustrates the attachment of an ESD shield according to an embodiment of the invention onto a printed circuit board.
Figure 5B:
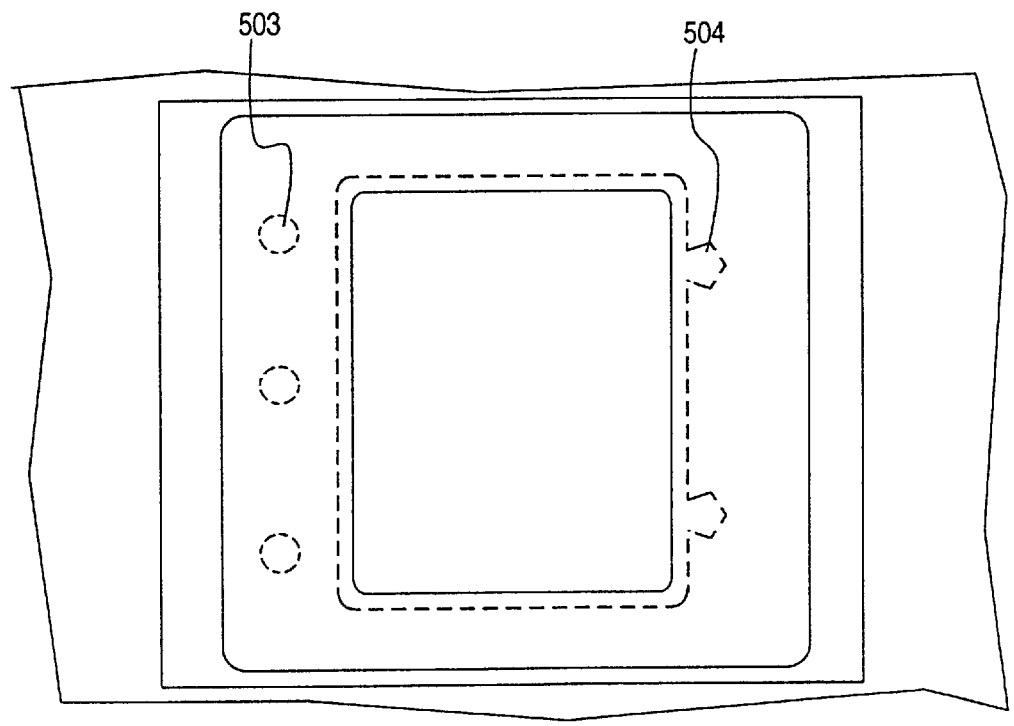

FIG. 5 consists of subparts 5a and 5b of which FIG. 5a is a partial cross-sectional view of a detail of the (extended) display frame according to an advantageous embodiment of the invention. FIG. 5b shows the same detail viewed from the direction perpendicular to the overall planar form of the extended display frame.

The detail shown in FIG. 5 is an opening along the edge of which an elastic gasket is to be attached: typically it is the opening for a display screen, a loudspeaker or a microphone. The edge 501 of the display frame is shown with simple hatch in FIG. 5a and an elastic gasket 502 is shown with a cross hatch. FIGS. 5a and 5b show that the edge of the display frame comprises specific attachment designs like holes 503 and notches 504 for providing a mechanical attachment between it and the elastic gasket.

An advantageous way of manufacturing a structure like that shown in FIGS. 5a and 5b is to place the extended display frame as a solid insert into a mold that is used for injection moulding the elastic gasket. During the injection moulding process the liquid or viscous raw material for the gasket is injected into the mold so that it solidifies into the form defined by the mold. Simultaneously it sticks to the exposed surfaces of the insert. The attachment designs 503 and 504 ensure a good mechanical attachment between the solidifying gasket and the edge of the extended display frame.

Figure 6:
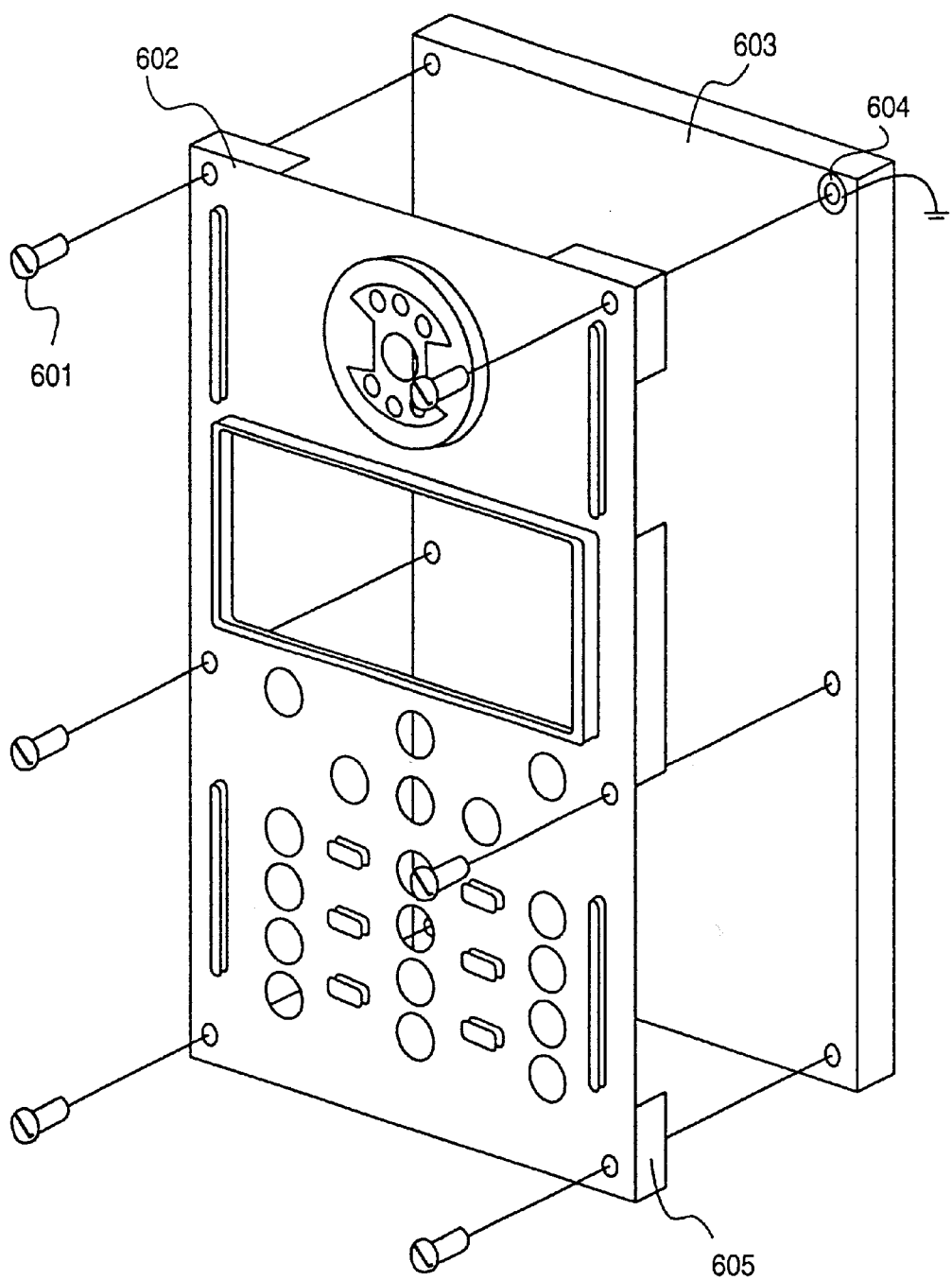

FIG. 6 shows how screws 601 can be used to fasten the ESD shield or extended display frame 602 to a printed circuit board 603. In order to provide grounding to the ESD shield or extended display frame 602, at least one of the screwholes in the printed circuit board 602 should have a grounded conductive pad 604 around it. FIG. 6 also shows how flaps 605 or other profiled portions may be formed to the edges of the ESD shield or extended display frame 602 in order to facilitate its easy alignment with the printed circuit board: the flaps shown in FIG. 6 are meant to be slid around the edges of the printed circuit board 603. Using screws as the attachment means has the advantage of enabling easy reopening for servicing and inspection, but the invention does not limit the choice of attachment means to screws. For example riveting, soldering and glueing can be used instead. Also the flaps 605 may be used for attaching. For the reasons of graphical clarity the other parts of the structure are not shown in FIG. 6. In the completed construction the ESD shield or extended display frame functions both as the mechanical holder for e.g. the display unit and the loudspeaker as well as a shield against ESD and EMI.

What is claimed is:

1. A display frame for a portable terminal comprising:
    a first extended portion which is elevated, perforated and thereby arranged to essentially cover a loudspeaker located in the vicinity of said display unit, and
    a second extended portion which is perforated and thereby arranged to essentially cover a keypad located in the vicinity of said display unit; wherein the display frame is adapted to hold the display unit in place with respect to a circuit board and to shield the display unit against electrostatic discharges, the display frame being adapted to be located inside an outer cover of the portable terminal and separated from the outer cover.

2. A display frame according to claim 1, wherein said second extended portion is also arranged to essentially cover a microphone located in the vicinity of said keypad.

3. A display frame according to claim 1, wherein a part of the display frame defines an opening and the display frame additionally comprises an integrated elastic gasket surrounding the edge of said opening, said integrated elastic gasket being permanently mechanically attached to the display frame.

4. A display frame according to claim 3, wherein the display frame is arranged to act as a solid insert for an elastic gasket made by injection moulding.

5. The display frame of claim 1 wherein the first extended portion and the second extended portion are positioned along a front portion of the inside of the outer cover of the portable terminal.

6. The device of claim 1 wherein the device is flexible conductive shield.

7. The device of claim 6 wherein the device serves as a mechanical holder of the user interface components on the printed circuit board without attachment of the outer cover.

8. A user interface construction for a portable terminal of a communication system, comprising:

a circuit board having a first surface, a keypad, a display unit and a loudspeaker on said first surface, an outer cover arranged to essentially cover said keypad, display unit and loudspeaker, and between the keypad, display unit and loudspeaker on one hand and the outer cover on the other hand, and physically separated from the outer cover, an extended display frame which is electrically conductive, coupled to a ground potential member appearing on the circuit board and arranged to hold the keypad, display unit and loudspeaker in place with respect to the circuit board and to essentially cover the keypad, the display unit and the loudspeaker so as to protect them against electrostatic discharges.

9. A user interface construction according to claim 8, comprising a microphone, so that said extended display frame is also arranged to hold the microphone in place with respect to the circuit board and to essentially cover the microphone.

10. A user interface construction according to claim 8, comprising between the display unit and the outer cover an elastic gasket which is permanently mechanically attached to said extended display frame.

11. A user interface construction according to claim 8, comprising between the loudspeaker and the outer cover an elastic gasket which is permanently mechanically attached to said extended display frame.

12. A user interface construction according to claim 8, comprising between the microphone and the outer cover an elastic gasket which is permanently mechanically attached to said extended display frame.

13. The user interface of claim 8, wherein the extended display frame allows a user to access and manipulate keys on the keypad.

14. A frame for a display in a portable terminal comprising:

an electrically conductive member adapted to cover user interface components on a printed circuit board of the portable terminal, the electrically conductive member including at least partial opening to allow user access to the user interface components;

the electrically conductive member being adapted to mechanically secure the display in place and provide an electrostatic discharge shield for the display separately from an outer cover of the portable terminal, the outer being adapted to be placed over the frame during assembly of the portable terminal.

15. The frame of claim 14 further comprising at least one integrated electrically conductive gasket surrounding at least one opening in the electrically conductive member, the gasket adapted to provide a physical separation between the frame and the outer cover and establish an electrical connection between the frame and the cover.

16. The frame of claim 14 wherein the electrically conductive member forms a contiguous electrically conductive plane across the user interface components of the portable terminal.

17. The frame of claim 14 wherein the display is secured to the printed circuit board by the frame independently of the outer cover.

18. The frame of claim 14 wherein a minimum physical separation exists between an interior surface of the outer cover and the electrically conductive member.

19. A display frame for holding a display unit in place with respect to a circuit board and for shielding the display unit against electrostatic discharges, comprising:

a first extended portion which is elevated, perforated and arranged to cover a loudspeaker located in the vicinity of said display unit;

a second extended portion which is perforated and arranged to cover a keypad located in the vicinity of said display unit; and wherein a part of the display frame defines an opening and the display frame additionally comprises an integrated elastic gasket surrounding the edge of said opening, said integrated elastic gasket being permanently mechanically attached to the display frame.

20. An electrostatic protection device for user interface components on a printed circuit board of a portable device comprising:

a single piece shield adapted to cover the user interface components and allow user access and manipulation of the components;

the shield adapted to secure in place each user interface component without any contact with an outer cover;

at least one elastic gasket integrated into the shield and adapted to surround at least one perimeter of at least one opening in the shield, the gasket adapted to prevent the outer cover from contacting a component beneath the at least one opening wherein the device protects the user interface components on the printed circuit board from electrostatic discharge.

21. The device of claim 20 wherein the at least one integrated gasket extends on either side of the protection device along the perimeter of the opening.

* * * * *